(12) United States Patent
Ying

(10) Patent No.: US 6,356,083 B1
(45) Date of Patent: Mar. 12, 2002

(54) STATE OF CHARGE ALGORITHM FOR A BATTERY

(75) Inventor: Ramona Y. Ying, Rochester Hills, MI (US)

(73) Assignee: General Motors Corporation, Detroit, MI (US)

( * ) Notice: Subject to any disclaimer, the term of this patent is extended or adjusted under 35 U.S.C. 154(b) by 0 days.

(21) Appl. No.: 09/778,979

(22) Filed: Feb. 7, 2001

(51) Int. Cl.$^7$ .............................................. G01N 27/416
(52) U.S. Cl. ....................................................... 324/426
(58) Field of Search .................................. 324/426, 427, 324/433, 434; 320/104, 132, 149, DIG. 21

(56) References Cited

U.S. PATENT DOCUMENTS 3,946,299 A * 3/1976 Christianson et al.
4,740,754 A * 4/1988 Finger
5,444,378 A * 8/1995 Rogers
5,451,881 A * 9/1995 Finger
6,232,747 B1 * 5/2001 Takahashi et al.

\* cited by examiner

*Primary Examiner*—Edward H. Tso
(74) *Attorney, Agent, or Firm*—Christopher DeVries

(57) ABSTRACT

A method and apparatus for determining the state of charge of a battery including the steps of determining whether the battery is in a charge decreasing, sustaining or increasing mode, integrating the charge going in and out of the battery to determine a current-based state of charge measurement if the battery is in a charge increasing or sustaining mode, and determining the open circuit voltage to determine an open circuit-based state of charge measurement if the battery is in a charge decreasing mode.

17 Claims, 9 Drawing Sheets

STATE OF CHARGE ALGORITHM FOR A BATTERY

TECHNICAL FIELD

The present invention relates to a battery pack operating in a hybrid-electric powertrain for a vehicle. More specifically, the present invention relates to a method of managing the state of charge for the battery pack.

BACKGROUND OF THE INVENTION

In today's automotive market, a variety of propulsion or drive technologies exist to power vehicles. The technologies include internal combustion engines (ICEs), electric drive systems utilizing batteries and/or fuel cells as an energy source, and hybrid systems utilizing a combination of internal combustion engines and electric drive systems. Each propulsion system has specific technological, financial and performance advantages and disadvantages, depending on the status of energy prices, energy infrastructure developments, environmental laws, and government incentives.

The increasing demand to improve fuel economy and reduce emissions in present vehicles has led to the development of advanced hybrid electric vehicles. Hybrid electric vehicles are classified as vehicles having at least two separate power sources, typically an internal combustion engine and an electric traction motor. Compared to standard vehicles driven by an ICE, hybrid vehicles have improved fuel economy and reduced emissions. During varying driving conditions, hybrid vehicles will alternate between the separate power sources, depending on the most efficient manner of operation of each power source. For example, a hybrid vehicle equipped with an ICE and an electric motor may shut down the ICE during a stopped or idle condition, allowing the electric motor to propel the vehicle and eventually restart the ICE, improving fuel economy for the hybrid vehicle.

Hybrid vehicles are broadly classified into series or parallel drivetrains, depending upon the configuration of the drivetrains. In a series drivetrain utilizing an ICE and an electric traction motor, only the electric motor drives the wheels of a vehicle. The ICE converts a fuel source to mechanical energy to turn a generator, which converts the mechanical energy to electrical energy to drive the electric motor. In a parallel hybrid drivetrain system, two power sources such as an ICE and an electric traction motor operate in parallel to propel a vehicle. Generally, a hybrid vehicle having a parallel drivetrain combines the power and range advantages of a conventional ICE with the efficiency and electrical regeneration capability of an electric motor to increase fuel economy and lower emissions, as compared with a traditional ICE vehicle. Further hybrid vehicles are described as being either charge-depleting or charge-sustaining with reference to the operation of an on-board battery pack. Charge-depleting hybrid vehicles can be charged off the electrical grid in a vehicle, and these hybrid vehicles share many of the characteristics of purely electrical vehicles. In contrast, the battery pack in a charge-sustaining hybrid vehicle receives all of its electrical charging from the ICE.

Battery packs having secondary/rechargeable batteries are an important component of hybrid vehicle systems, as they enable an electric motor/generator (MoGen) to store braking energy in the battery pack during regeneration and charging by the ICE. The MoGen utilizes the stored energy in the battery pack to propel or drive the vehicle when the ICE is not operating. During operation, the ICE will be shut on and off intermittently, according to driving conditions, causing the battery pack to be constantly charged and discharged by the MoGen. The state of charge (SOC), defined as the percentage of the full capacity of a battery that is still available for further discharge, is used to regulate the charging and discharging of the battery.

The preferred embodiment of the present invention utilizes a nickel/metal hydride (Ni/MH) battery in the battery pack. A NiMH battery stores hydrogen in a metal alloy. When a NiMH cell is charged, hydrogen generated by the cell electrolyte is stored in the metal alloy (M) in the negative electrode. Meanwhile, at the positive electrode, which typically consists of nickel hydroxide loaded in a nickel foam substrate, a hydrogen ion is ejected and the nickel is oxidized to a higher valency. On discharge, the reactions reverse. The reactions at the positive and negative electrode are more clearly shown by the following reaction diagram:

Positive: 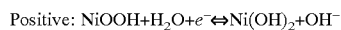

Negative: 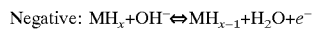

The discharging direction is represented by $\Rightarrow$. The charging direction is represented by $\Leftarrow$. On discharge, OH− ions are consumed at the negative hydride electrode and generated at the nickel oxide positive electrode. The converse is true for water molecules.

A difficulty in predicting the SOC of a NiMH battery based solely on the current-voltage characteristics is associated with the voltage hysteresis during charge and discharge. FIG. 1 shows some typical SOC versus open circuit voltage (OCV) curves during charge increasing 10 and charge decreasing 12 operations of a NiMH battery. For the same OCV in reference points A and B, the SOC is significantly different, depending on whether the battery is charge increasing or decreasing. Also, note that the range in voltage for points C and D is small even though the SOCs are substantially different. Thus, it is very difficult to use the OCV as an accurate SOC indicator of the NiMH battery, as the battery's mode of operation (charge increasing, charge sustaining or charge decreasing) must be known. When used with a hybrid vehicle, the intermittent charging and discharging of the battery pack amplifies the problems associated with predicting the SOC of a NiMH battery back.

SUMMARY OF THE INVENTION

The present invention includes a method and apparatus to calculate or predict the state of charge (SOC) of a battery pack utilizing NiMH batteries or any other battery technology known in the art including, but not limited to, lead-acid, lithium-ion or lithium-polymer batteries. The method of the present invention includes an SOC algorithm that uses three independent methods to determine the SOC of a battery and selects the appropriate SOC depending on the mode of battery operation. A first method is amp-hour integration, which generates an accurate coulombic count of the charge going in and out of the battery pack. This current-based SOC estimation method is termed ISOC and is mainly used during charge sustaining (CS) or charge increasing (CI) operation of the battery pack. A second method is based on a SOC correlated to an average open circuit voltage. This voltage-based SOC estimation is termed VSOC and is mainly used during the charge decreasing (CD) operation of the battery pack. A third method determines the SOC based on the measured open circuit voltage after the vehicle is turned off, i.e., at the end of operation of the battery pack where parasitic loss and self-discharging are present. This method is termed RSOC, where "R" stands for rest. The RSOC is used to reset the predicted SOC of the battery if the ISOC and VSOC generate dissimilar results during a CD operation. The SOC method of the present invention compares the three SOC values generated by the three methods detailed above and selects the appropriate SOC value depending on the type of battery operation (CD, CS, or CI).

The present invention further includes a vehicle having a parallel hybrid drive system incorporating a hybrid system controller executing the methods of the present invention, an ICE, and the MoGen that charges and discharges the battery pack. The MoGen not only provides for propulsion of the vehicle during certain vehicle operating conditions but also replaces an alternator to charge the battery pack in the vehicle and replaces a conventional starter motor to start the ICE. The hybrid drive system of the present invention will utilize the ICE and MoGen to propel or motor the vehicle during the vehicle conditions, which are most efficient for the ICE or MoGen operation. For example, during deceleration or a stopped condition, fuel flow to the ICE may be cut off, as these conditions are some of the least efficient conditions to run the ICE. The MoGen system becomes the active propulsion or motoring system during this fuel cut-off feature and powers the vehicle without noticeably disturbing the operation of the vehicle or sacrificing driveability. The MoGen will propel the vehicle and smoothly transition the vehicle from the idle or stopped state and start the ICE for ICE driving conditions. The transfer of power between the MoGen and ICE or vice versa is transparent to the operator or driver, as the vehicle will perform as if there is only one drive system propelling the vehicle.

During normal operation of the vehicle when the ICE is running, the MoGen will act as an electrical generator to supply electrical power to the vehicle's electrical infrastructure (fans, radios, instrumentation, control, etc.) as well as recharging the battery pack. The battery pack and a power supply, such as a DC-DC converter, will supply power to the vehicle electrical infrastructure and power the MoGen when it is operating as the motoring device for the vehicle. In the motoring mode, the MoGen is an electrical load drawing current from the battery pack.

DESCRIPTION OF THE PREFERRED EMBODIMENT

Figure 1:
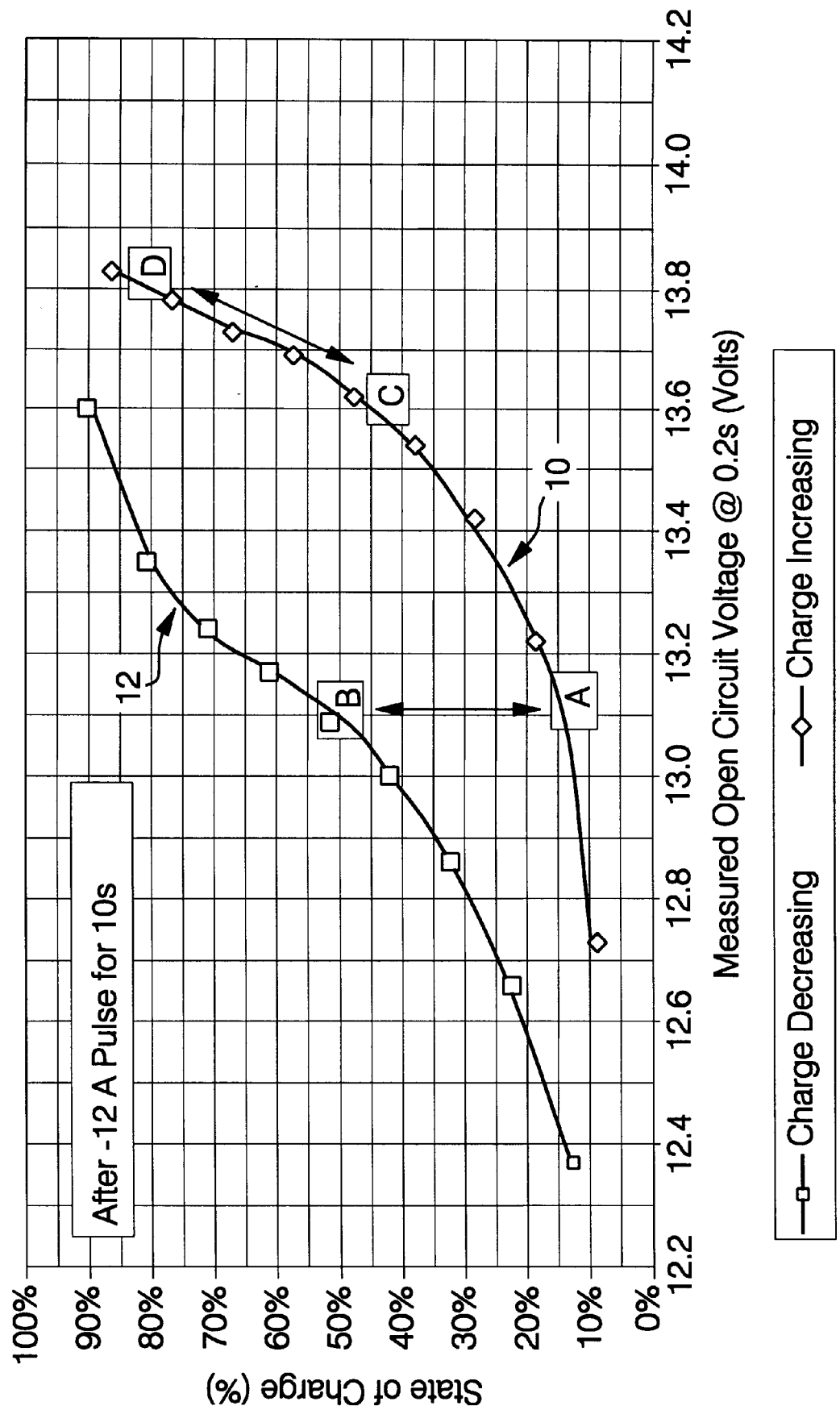
FIG. 1 is a plot of NiMH battery open circuit voltages during a charge decreasing operation (upper curve) and a charge increasing operation (lower curve)
Figure 2:
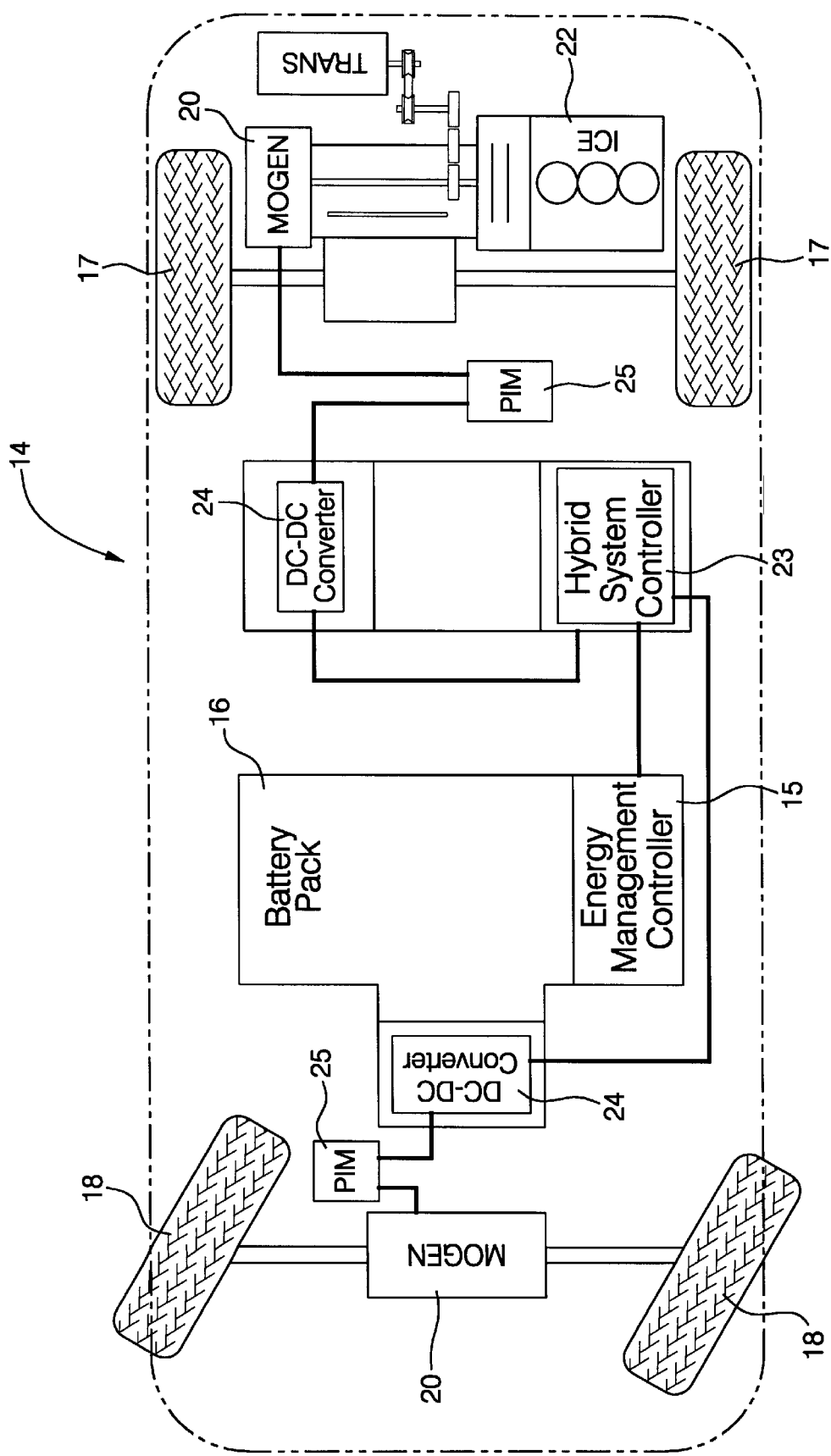
FIG. 2 is a diagrammatic drawing of the hybrid electric vehicle of the present invention.

FIG. 2 is a diagrammatic drawing of a hybrid vehicle 14 of the present invention. The hybrid vehicle 14 includes a battery pack 16 having a single battery module or individual battery modules. In the preferred embodiment, the battery pack 16 comprises a plurality of NiMH batteries connected in series to produce a 336-Volt nominal bus. In alternate embodiments of the present invention, the battery pack 16 may comprise any known battery technology including but not limited to lead-acid, lithium-ion, and lithium polymer. An energy management controller (EMC) 15 monitors the current, voltage, state of charge (SOC), and power output of the battery pack 16.

A motor generator (MoGen) 20 is dynamically coupled to an internal combustion engine (ICE) 22 and functions as either a motor to propel the vehicle 14 or a generator to charge the battery pack 16, depending on the operating state of the vehicle 14 (i.e., braking, accelerating, or operating at a constant speed on a highway). The MoGen 20 is preferably an AC induction machine, but may comprise any known electrical motor/generator technology including but not limited to DC machines, synchronous machines, and switched reluctance machines. The MoGen 20 in the preferred embodiment is located on the rear of the vehicle to drive the rear wheels 17. A similar MoGen 20 is located on the front of the vehicle to drive the front wheels 18.

The MoGens 20 are controlled by an electrical control system comprising a hybrid system controller 23, DC-DC converters 24 and power inverter modules 25. The EMC 15 communicates with the hybrid system controller 23 and power inverter modules 25 to provide voltage, current, and/or power output/input limits for the battery pack 16 based on a SOC measurement. In alternate embodiments of the present invention, the EMC 15, hybrid system controller 23, DC-DC converters 24, and power inverter modules 25 may be configured as a unitary system. The EMC 15 and hybrid system controller 23 may comprise any type of control module or vehicle controller known in the art, and are equipped with nonvolatile memory (NVM), random access memory (RAM), discrete and analog input/output (I/O), a central processing unit, and communications interfaces for networking within an automotive communications network.

In generator mode, the MoGens 20 generate electrical energy that is transferred to the battery pack 16 and the DC-DC converters 24 by the controller 23 and inverter modules 25. The controller 23 and inverter modules 25 determine the direction of current flow for the MoGen 20, according to the vehicle 14 operating state. The DC-DC converters 24 provide and regulate the DC bus that is pulse-width-modulated by the inverter modules 25 to supply time varying current to the MoGens 20. In a regeneration state (such as during braking) or charging condition, current will flow from the MoGens 20, via the inverter modules 25, to charge the battery pack 16 and provide current to the DC-DC converters 24. In a state where the MoGens 20 are needed to provide propulsion, current will flow from the battery pack 16 of the MoGens 20, via the DC-DC converters 24 and inverter modules 25, to power the MoGens 20.

In the preferred embodiment of the present invention, the SOC of the battery pack 16 is dynamically tracked to determine when to charge the battery pack 16. The EMC 15 and hybrid controller 23 of the present invention will control a battery pack's state-of-charge (SOC) near 50% to 70% so that the charge acceptance and efficiency during regenerative braking can be realized. However, controlling the battery pack 16 to any SOC percentage is within the scope of the present invention.

As discussed previously, the methods executed by the EMC 15 to determine the SOC of the battery pack 16 include a current-based SOC method and measurement (ISOC), a voltage-based SOC method and measurement (VSOC), and a rest SOC method and measurement (RSOC). A selection method then determines which SOC measurement is the most accurate, depending on the operation of the battery pack 16.

Current-Based SOC Estimation Method, ISOC

Figure 3:
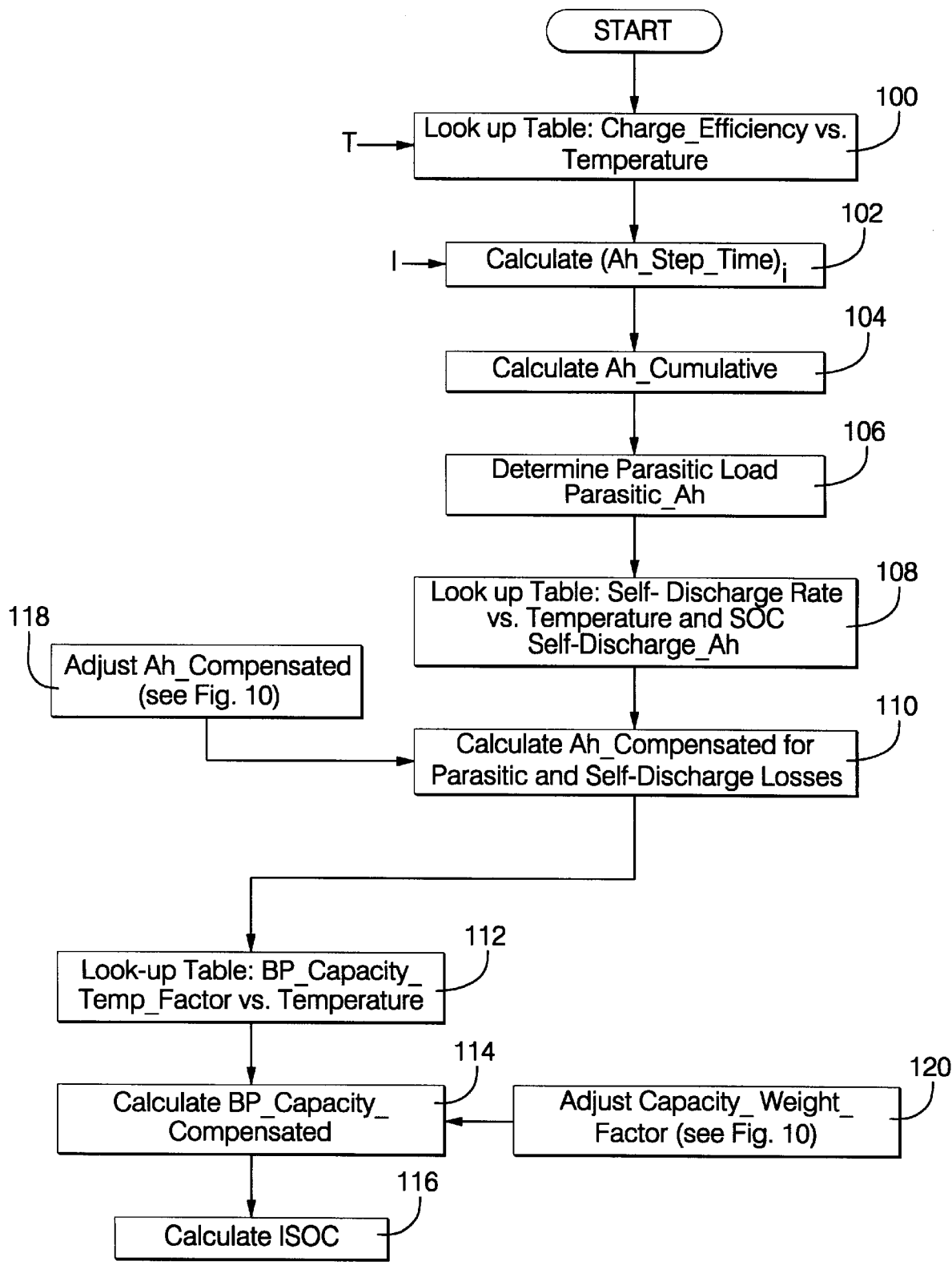
FIG. 3 is a flow chart of the current-based SOC method (ISOC)

FIG. 3 is a flow chart of the preferred current-based SOC (ISOC) determination method of the present invention. The sign convention for current in this specification is positive for charge and negative for discharge. Accordingly, a charging coulomb is positive and a discharging coulomb is negative. Because of secondary reactions, not all coulombs are used to convert the active materials. Therefore, a charge efficiency term is introduced at the start of the ISOC method at block 100. For discharge (i.e., $I_i<0$), Charge_Efficiency= 1.0. For charge (i.e., $I_i>0$), Charge_Efficiency is a function of temperature and SOC and is stored in a table in the nonvolatile more of the EMC 15. Typically, the charge efficiency decreases at high temperatures and high SOCs.

Following the determination of Charge_Efficiency, block 102 calculates the incremental number of coulombs, Ah_Step_Time, flowing in or out of the battery pack 16 over a time interval, $t_i - t_{i-1}$, by averaging the current $I_i$ at $t_i$ and $I_{i-1}$ at $t_{i-1}$ using the equation:

$$(Ah\_Step\_Time)_i = Charge\_Efficiency * \left(\frac{I_i + I_{i-1}}{2}\right) * (t_i - t_{i-1})$$

while also taking into account the charge efficiency of the coulombs going toward active material conversion.

The summation of the incremental number of coulombs charging and discharging the battery pack 16, Ah_Cumulative, is defined in block 104 as:

$$Ah\_Cumulative = \sum_i (Ah\_Step\_Time)_i$$

where Ah_Cumulative is bounded between 0 for a fully-charged battery pack 16 and the total capacity of the fully-discharged battery pack 16, which is negative in value.

Other sources of discharge on the battery pack 16 such as parasitic loads and self-discharge need to be factored into the coulomb count to determine an accurate SOC measurement. At block 106, all the currents associated with the parasitic drain, Parasitic_Ah_Rate, on the battery pack 16 for non-propulsion use must be measured so that the parasitic loss can be calculated at bock 106 using the equation:

Parasitic_Ah = Parasitic_Ah_Rate*Last_Charge_Time where the Last_Charge_Time is the length of time since the battery pack 16 was fully charged.

Continuing to block 108, the Self_Discharge_Rate is measured as a function of temperature and SOC, and stored in a table in the nonvolatile memory of the EMC 15. The number of coulombs lost due to self-discharge is calculated using the equation:

Self_Discharge_Ah=Self_Discharge_Rate*Last_Charge_Time

Thus, the cumulative Ah_Compensated for parasitic and self-discharge losses at block 110 and 118 is calculated using the equation:

Ah_Compensated=Ah_Cumulative-Parasitic_Ah–Self_Discharge_Ah

Figure 10:
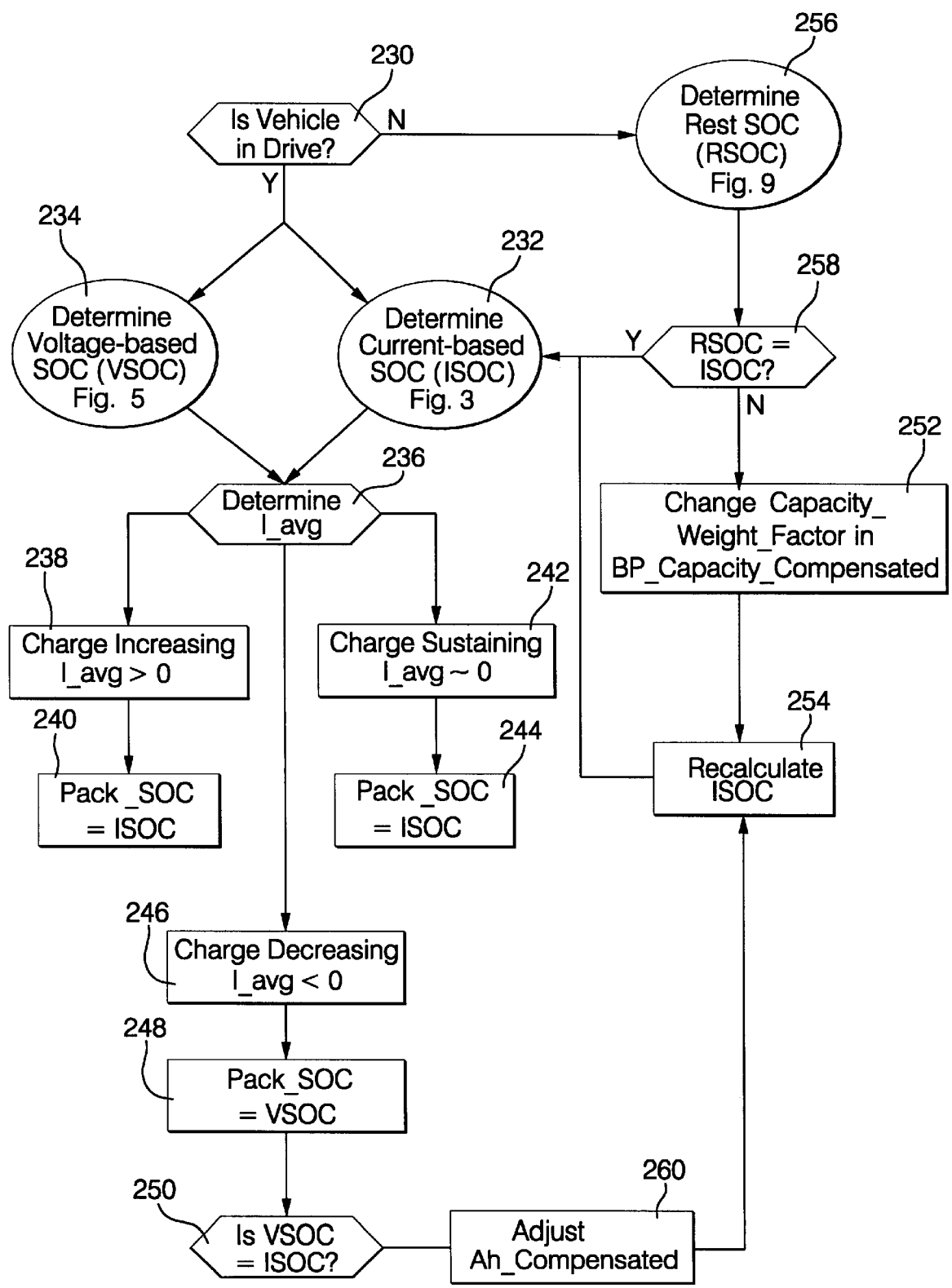
FIG. 10 is a flow chart of the SOC method used to select the most appropriate SOC value determined from the ISOC, the VSOC, and the RSOC methods.

Ah_Compensated is adjusted at block 118 according to the algorithm outlined at block 252 of FIG. 10.

Temperature and age may also affect the total capacity of the battery pack 16. When the battery pack 16 is new, the total capacity is BP_Capacity_Default at a reference temperature. For temperatures other than the referenced one, the BP_Capacity_Default is multiplied by a BP_Capacity_Temp_Factor, stored in a table in the nonvolatile memory of the EMC 15 at block 112. The BP_Capacity_Compensated is calculated at block 114 using the equation:

BP_Capacity_Compensated=(BP_Capacity_Default*BP_Capacity_Temp_Factor)*Capacity_Weight_Factor where the default Capacity_Weight_Factor=1.0 when the battery pack 16 is new. If, however, there is a discrepancy in the SOCs determined by the three methods ISOC, VSOC and RSOC, then the Capacity_Weight_Factor is adjusted at block 120 according to the SOC algorithm outlined at block 260 of FIG. 10. It should be filtered and bounded such that the Pack_SOC does not change drastically over short times.

The current-based SOC, ISOC, is calculated at block 116 using the equation:

$$ISOC = \left(1 - \frac{Ah\_Compensated}{BP\_Capacity\_Compensated}\right) * 100\%$$

Mode of Battery Operation

Figure 4:
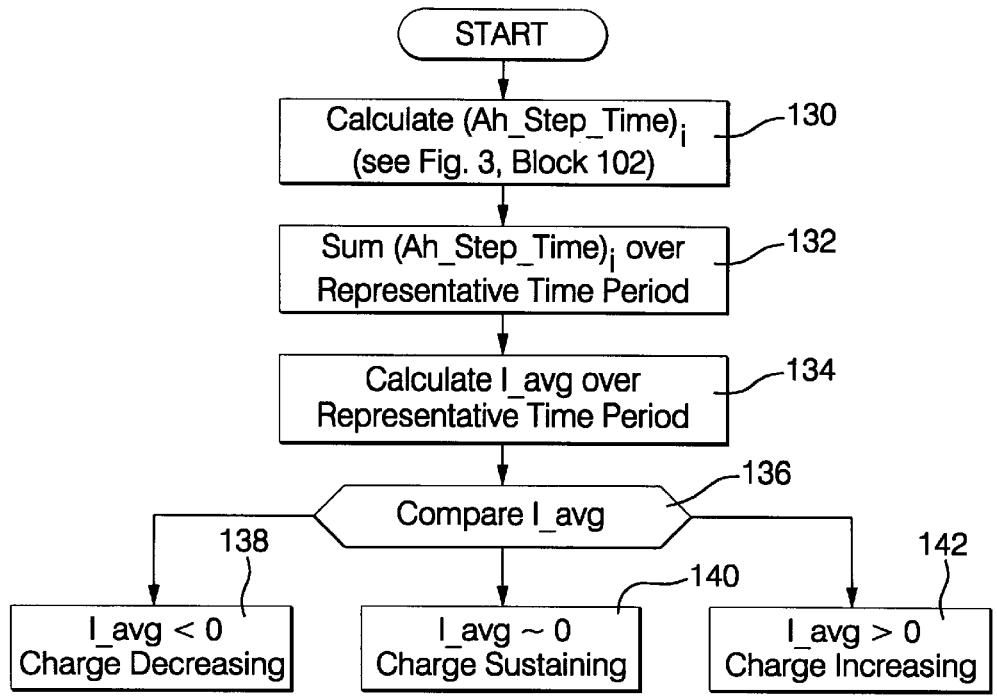
FIG. 4 is a flow chart of the method used to calculate the average current of the battery in order to determine the mode of battery operation.

The average current (I_avg) of the battery pack 16 must be calculated to determine if the battery pack 16 is operating in a charge decreasing (CD, I_avg<0), charge sustaining (CS, I_avg~0) or charge increasing (CI, I_avg>0) mode. A flow chart is shown in FIG. 4 illustrating the preferred method of determining the battery pack 16 operating mode. In a hybrid application, it is assumed that the default I_avg is zero, i.e., in a charge-sustaining mode. The time period over which the averaging is done should be representative of the overall mode of the battery pack 16 operation. For example, for a minute of operation, the cumulative Ah is summed over a minute, not including any rest time, and then converted to an hourly rate in blocks 130–134 using the formulas:

$$Ah\_Last\_Minute = \sum_i^{60s} (Ah\_Step\_Time)_i \quad Ah/minute$$

I_avg=Ah_Last_Minute*60minutes/hour

Ah_Step_Time is adjusted at block 130 according to the SOC algorithm outlined at block 102 of FIG. 3.

The I_avg calculations are compared to zero at blocks 136–142 to determine whether the battery pack 16 is in a CD, CS, or CI mode. Note that the Ah_Last_Minute and I_avg calculations should only use non-zero current data, such that I_avg would not be skewed by the rest times.

Although the time period used in the above equations is one minute, any time interval that is representative of the mode of the battery pack 16 is within the scope of the present invention.

Voltage-Based SOC, VSOC

Figure 5:
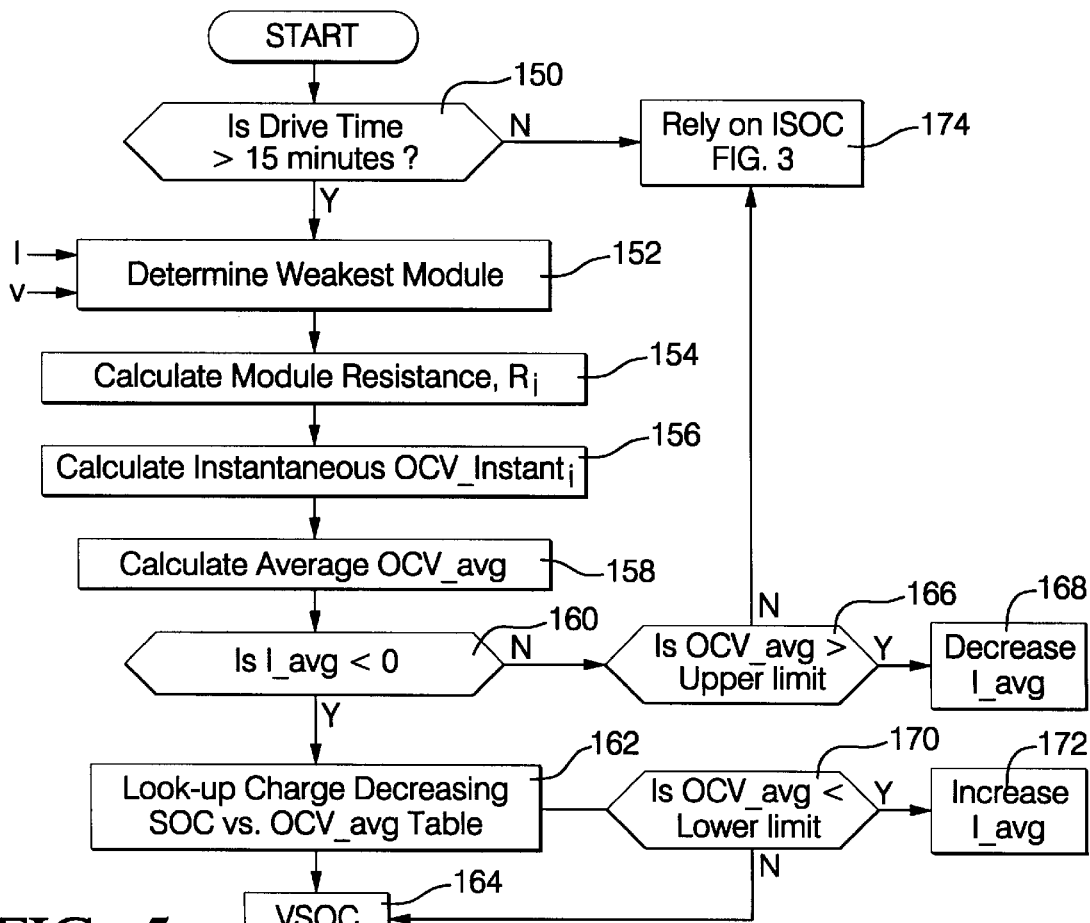
FIG. 5 is a flow chart of the voltage-based SOC method (VSOC)

FIG. 5 shows a flow chart of the preferred voltage-based SOC, VSOC, determination method of the present invention. Generally, a voltage-based SOC is not reliable after long periods of battery pack 16 inactivity because of higher polarizations associated with the inactivity. The VSOC method, beginning at block 150, determines if the vehicle 14 has been operated for approximately 15 minutes before performing a VSOC calculation. During this period at block 174, the EMC 15 will rely on the ISOC method of FIG. 3 to determine the SOC of the battery pack 16. The SOC of a battery pack 16 is dictated by the weakest module, thus all modules must have voltage sense leads coupled to the EMC 15 to indicate the voltage levels of the modules. Block 152 determines the weakest module, in the preferred embodiment of the present invention, by picking the module with the lowest voltage on discharge on a daily basis. The current voltage (I, V) response of the weakest module is used in the VSOC determination and the (I, V) data for this module is preferably synchronous when used for this analysis. Because the battery pack 16 is generally always under load, the open circuit voltage needs to be back-calculated and correlated to a SOC. Assuming that the NiMH battery acts like an ohmic battery, then:

$$V - V_0 = IR$$

where $V_0$ is the open circuit voltage and R is the module resistance, which is an unknown.

At block 154, the instantaneous module resistance of the weakest module is determined using the equation:

$$\text{Module\_Resistance}_i = \frac{V_i - V_{i-1}}{I_i - I_{i-1}}$$

where $t_i - t_{i-1} < 1s$ is and the absolute value of $(I_i - I_{i-1}) > 1$ Amp, to ensure that that the denominator does not "blow up" the result of the equation. The same time interval $(t_i - t_{i-1})$ must be used and is preferably 0.2 seconds in the resistance calculation. For small changes in I, delta $I < 1$ A, the previously calculated Module_Resistance$_i$ is used to calculate the OCV_Instant$_I$ at block 156. The effects of battery age and temperature are also accounted for in the calculated resistance value.

The instantaneous open circuit voltage OCV_Instant$_i$, is determined at block 156 at a time interval of 0.2 seconds using the equation:

$$OCV\_\text{Instant}_i = V_i - (I_i * \text{Module\_Resistance}_i)$$

Figure 6:
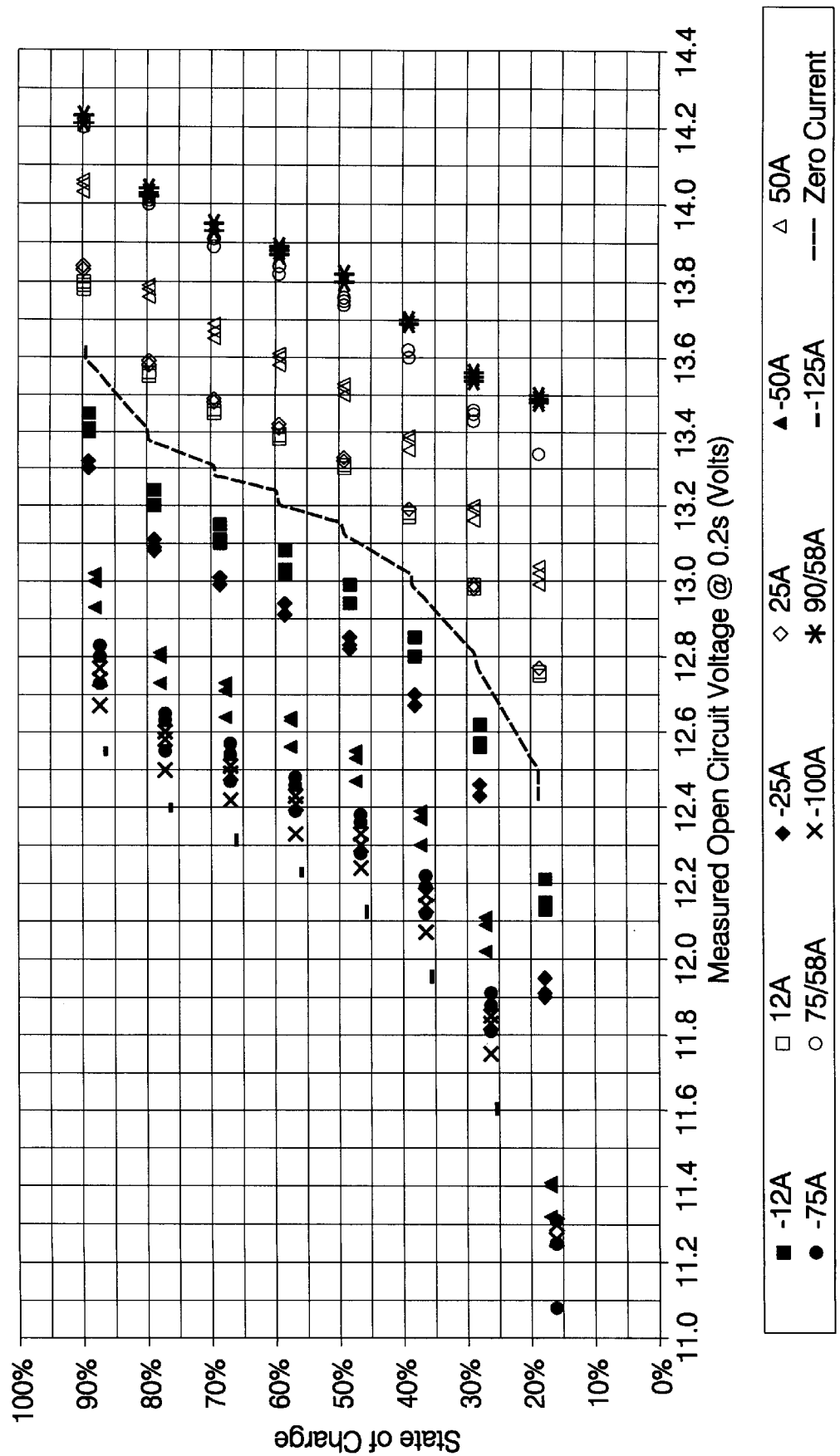
FIG. 6 is a graph of the SOC versus open circuit voltage measured 0.2 second after various 10-second current pulses during charge decreasing operation of a NiMH battery.

The correlation of the OCV_Instant$_i$ to SOC is dependent on the prior current pulse as shown in FIG. 6 for a charge-decreasing (CD) battery operation. The OCV_Instant$_i$ becomes difficult to track for SOC during a CD operation. However, the curves in FIG. 6 illustrate that at the same SOC, the measured OCV increases in a systematic order with current. The curves mirror each other about a "zero" current curve, i.e., shown by a dashed curve between the ±12 Amp curves. In a hybrid application where the battery pack 16 is constantly being discharged and charged, an average OCV can be calculated and correlated to the SOC based on this "zero" current calibration curve for a CD operation. This curve is slightly dependent on the rate of charge depletion, so separate calibration curves are needed for different average discharge rates, I_avg.

Figure 7:
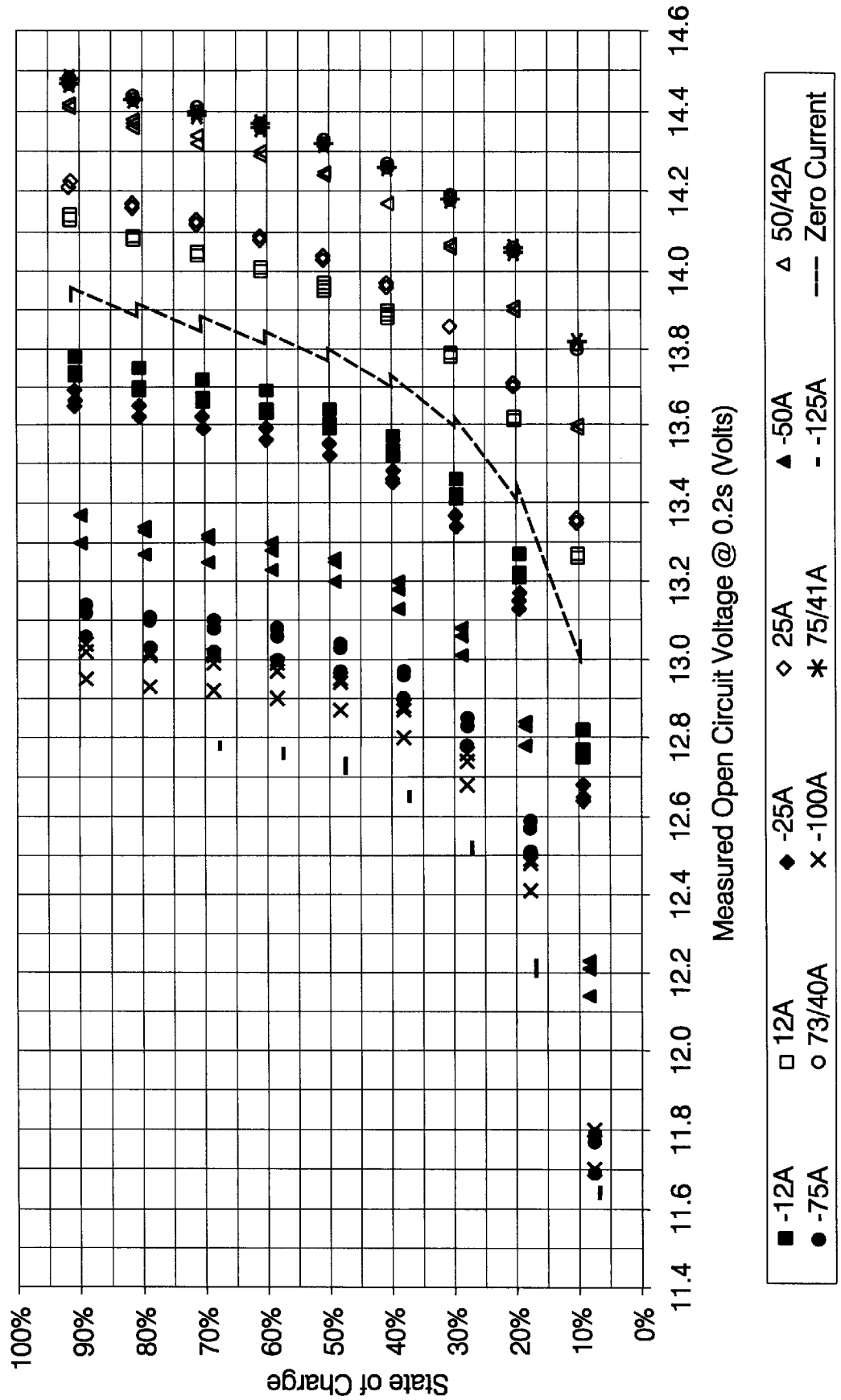
FIG. 7 is a graph of the SOC versus open circuit voltage measured 0.2 second after various 10-second current pulses during charge increasing operation of a NiMH battery.
Figure 8:
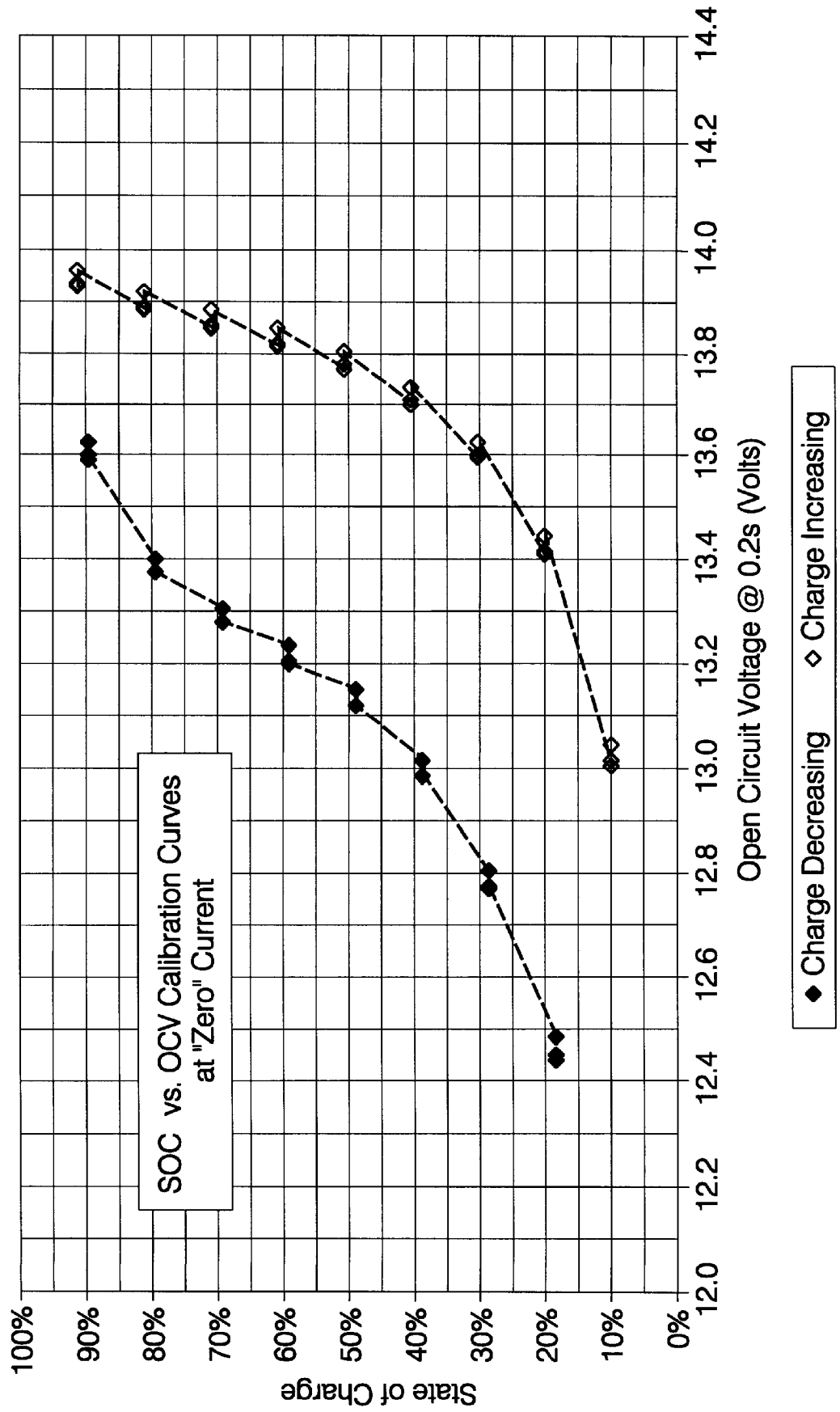
FIG. 8 is a graph of the SOC versus open circuit voltage curves for "zero" current during charge decreasing and charge increasing operations of a NiMH battery.

In FIG. 7, a similar set of SOC versus OCV curves are shown following current pulses for a charge increasing (CI) operation at different SOCs. The "zero" current SOC versus OCV is shown as the dashed curve for a CI operation. This curve is independent of the rate of charge increase. FIG. 8 summarizes the SOC versus OCV calibration curves based on the "zero" current curves for both CD and CI operations. Look-up tables for these calibration curves can be generated and stored in the nonvolatile memory of the ECM 15.

Therefore, in order to correlate to an SOC, the average open circuit voltage, OCV_avg, needs to be determined at block 158 using the equation:

$$OCV\_\text{avg} = \frac{\sum_i OCV\_\text{Instant}_i * dt_{i,on}}{\sum_i dt_{i,on}}$$

where the OCV_Instant$_i$ is time-averaged over one to two minutes. Note that $dt_{i,on}$ is only for power-on operations, so that rest data is not used in the averaging. The OCV measured during rest is highly dependent on the previous current experienced by the battery module and will skew the average OCV during power-on.

The OCV_avg is correlated to the voltage-based SOC using the calibration curves in FIG. 8 for a CD (I_avg<0) or a CI (I_avg >0) operation, respectively. During hybrid cycling, the VSOC method was found to be most useful for a CD operation. Block 160 determines if the battery pack 16/module is in a CD operation. If the module is in a CD operation, a look-up table in the non-volatile memory of the EMC 15 will be used to determine the VSOC of the battery pack 16 at blocks 162 and 164.

However, the OCV_avg calculated during a CI operation at block 166 can be used to monitor the upper SOC bound from the CI curve in FIG. 8. For example, an OCV_avg of 13.9 V during a CI operation would correspond to 80% SOC, which should indicate to the ECM 15 to decrease I_avg and thus lower the SOC at block 168. Conversely, if in a CD operation, the OCV_avg is below the lower SOC limit at block 170 (i.e., 30% SOC at 12.8 V on the CD curve in FIG. 8), then the ECM 15 should increase I_avg in block 172 to raise the SOC. In a CS or CI operation, the EMC 15 will rely on the ISOC method of block 174 in FIG. 3 to determine the SOC of the battery pack 16.

Rest SOC, RSOC

Figure 9:
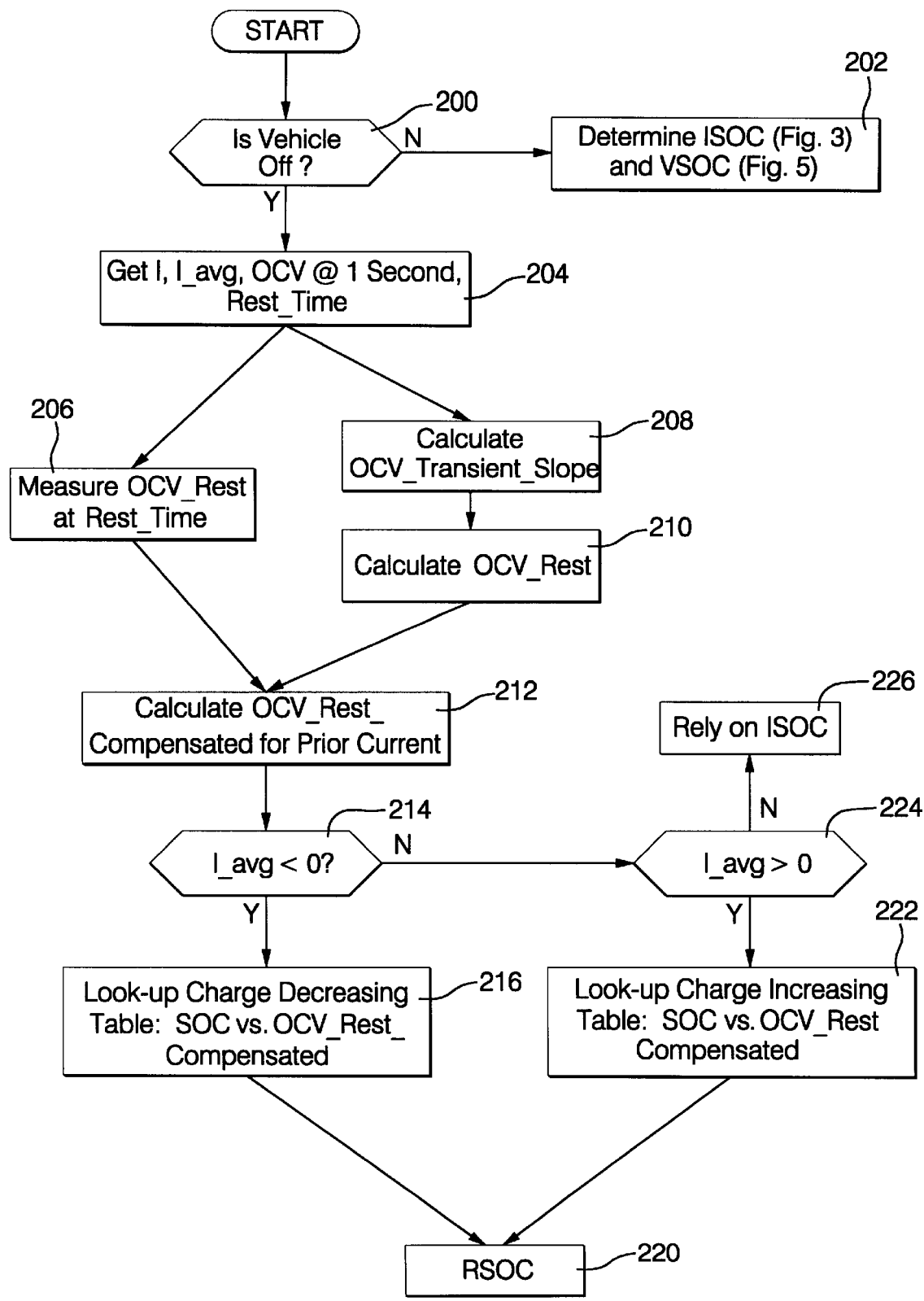
FIG. 9 is a flow chart of the SOC method based on the open circuit voltage measured after the vehicle is turned off (RSOC)

Another opportunity to determine the SOC of the battery pack 16 is during the rest period after the vehicle 14 has been turned off. FIG. 9 is a flow chart of this RSOC method based on the rest OCV. Starting at block 200 of the RSOC method, the vehicle 14 is determined to be on or off. If the vehicle 14 is on, then at block 202 the ISOC and VSOC methods previously discussed are used to determine the SOC of the battery pack 16. Referring to FIGS. 6 and 7, the SOC versus OCV relationship is shown to be dependent on the recent history of the current loads before the rest period. Because it is difficult to calibrate for every possible combination of events, the RSOC method should be considered only if ISOC and VSOC values are dissimilar during CD operation.

Continuing to block 204, the prior current, average current, OCV is measured after one second and a rest time. To correlate the measured OCV to the SOC, the rest time should be consistent with the data used to calibrate the parameters needed in this method. It can be as short as 0.2 second to as long as an hour. The longer the rest time means the lesser the current dependency in the SOC versus OCV relationship. However, if the rest time is too long (e.g., >one hour), then self-discharge and parasitic losses must also be considered in the SOC calculation.

The preferred method to get the OCV at the specified rest time is to measure the OCV at block 206 and then to proceed directly to block 212 to compensate for the current-dependency term in the SOC-OCV relationship. However, if the OCV cannot be measured after the vehicle is turned off, then it can be calculated for the specified rest time in blocks 208 and 210 which require that the OCV transients to be characterized beforehand as follows.

After various current pulses, the OCV needs to be measured for the specified rest time. These OCV transient curves are logarithmically fitted in the following format:

$$OCV = m*ln(t) + c$$

where OCV is a function of t, the rest time in seconds; m is the slope and c is the intercept, or OCV at 1 second.

The rate at which the OCV relaxes, OCV_Transient_Slope at block 208, has been found to be dependent on the Current_Before_Rest using the equation:

$$OCV\_Transient\_Slope = OCV\_Transient\_Factor * Current\_Before\_Rest$$

where the OCV_Transient_Factor is the slope of the plot of m versus Current_Before_Rest.

The fitted equation is used to calculate the OCV Rest at block 210 using the equation:

$$OCV\_Rest = OCV\_Transient\_Slope * ln(Rest\_Time) + OCV\_Constant$$

where the Rest_Time is specified in seconds and the OCV_Constant is the OCV measured preferably one second after key-off.

At block 212, the OCV_Rest calculated for the final current pulse needs to be adjusted to the "zero"-current curves shown in FIG. 8 by using the equation:

$$OCV\_Rest\_Compensated = OCV\_Rest - (Current\_Before\_Rest * OCV\_Rest\_Current\_Factor)$$

where OCV_Rest_Current_Factor is the slope of the measured OCV versus the prior current pulse for a fixed SOC based on graphs similar to FIG. 6 or 7. Block 214 determines if the battery pack 16 is in a CD operating mode. If the battery pack 16 is in a CD operation, then at block 216 the OCV_Rest_Compensated is used to determine RSOC using the appropriate "zero"-current curve in FIG. 8. If the battery pack 16 is not in a CD operation, then at block 224 it will be determined if the battery pack 16 is in a CI operation. If the battery pack in not in a CI operation (now determined to be in a CS mode), then the ISOC method will be used to determine the SOC of the battery pack 16. If the battery pack is in a CI operation, then at block 222 a CI look-up table will be used to determine the SOC using the OCV_Rest_Compensated value. Block 220 represents the resultant RSOC value.

Pack_SOC Based on ISOC, VSOC or RSOC

FIG. 10 is a flow chart of the SOC algorithm to select the most appropriate method to determine Pack_SOC from the ISOC, VSOC or RSOC methods and values, depending on the battery's mode of operation (i.e., based on the average current). At block 230, if the vehicle is in drive, then the ISOC and VSOC methods are executed at blocks 232 and 234 to generate battery pack 16 SOC values. Otherwise, if the vehicle is turned off, then the RSOC method at block 256 generates an SOC value of the battery pack 16.

As previously discussed, during operation of the vehicle 14, it is important to determine if the battery pack 16 is operating in a charge sustaining (CS), charge increasing (CI), or charge decreasing (CD) mode by calculating I_avg in at block 236. Generally, the VSOC versus OCV_avg correlation is only valid in a CD operation. Therefore, the voltage-based SOC method can be also used in an electric vehicle application, which is basically a CD battery operation. When the battery is in a CS or CI mode, the OCV_avg migrates between the CD and CI curves in FIG. 8. Thus, depending on the mode of battery operation, the Pack_SOC is as follows:

Charge Sustaining Operation (I_avg~0) is determined at block 242 and at block 248:

$$Pack\_SOC = ISOC$$

Thus, the SOC of the battery pack 16 is equal to the SOC as determined by the ISOC method.

OCV_avg should be bounded between the CD and CI curves in FIG. 8. If this is not true, then the Pack_SOC with RSOC (when executed) should be compared at block 258 during the next rest period. In certain situation, I_avg may be forced less than zero, such that VSOC can be compared with ISOC at block 250.

Charge Increasing and Sustaining Operation (I_avg>0) is determined at block 238 and at block 244:

$$Pack\_SOC = ISOC$$

If OCV_avg is greater than the upper SOC limit (e.g., 13.9 V for 80% SOC on CI curve in FIG. 8), then decrease I_avg to lower the SOC.

Charge Decreasing Operation (I_avg<0) is determined at block 246 and at block 248:

$$Pack\_SOC = VSOC$$

Thus, the SOC of the battery pack 16 is equal to the SOC as determined by the VSOC method.

The VSOC, ISOC and RSOC values are determined as detailed above. If OCV_avg is less than the lower SOC limit (e.g., 12.8 V for ~30% SOC on the CD curve in FIG. 8), then increase I_avg to increase the SOC.

During CD operation, the VSOC and ISOC should be equivalent. However, when transitioning from CS to CD or from CI to CD operation, VSOC does not immediately take into effect. Thus, ISOC should be relied on until the OCV_avg is back on the CD curve.

The error on the Ah_Compensated term in the ISOC calculation can build up over time due to small errors in the Ah count, parasitic losses and/or self-discharge compensations. Therefore, periodic adjustment of the Ah_Compensated term can be made by comparing the VSOC and ISOC during CD operation as determined at block 250. The Ah_Compensated term at block 252 may be adjusted using the equation:

$$Ah\_Compensated\_New = Ah\_Compensated\_Old - (VSOC - ISOC) * BP\_Capacity\_Compensated$$

Then, the ISOC will be recalculated at blocks 254 and 232.

If the RSOC value is different from ISOC value, another source of error may be due to the BP_Capacity_Compensated term in the ISOC calculation. In this case, the Capacity_Weight_Factor can be adjusted at block 260 using the equation:

$$Capacity\_Weight\_Factor = (1 - ISOC)/(1 - VSOC)$$

While this invention has been described in terms of some specific embodiments, it will be appreciated that other forms can readily be adapted by one skilled in the art. Accordingly, the scope of this invention is to be considered limited only by the following claims.

What is claimed is:

1. A method of determining the state of charge of a battery comprising the steps of:
   determining whether the battery is in a charge decreasing or increasing mode;
   integrating the charge going in and out of the battery to determine a current-based state of charge measurement if the battery is in a charge increasing mode; and
   determining the open circuit voltage to determine an open circuit-based state of charge measurement if the battery is in a charge decreasing mode.

2. The method of claim 1 wherein the step of determining whether the battery is in a charge increasing or charge decreasing mode comprises calculating average current over a time period.

3. The method of claim 1 wherein the time period is a minute.

4. The method of claim 1 further comprising the step of determining a third state of charge measurement of the battery based on the measured open circuit voltage depending on the last current draw at the end of operation of the battery.

5. The method of claim 4 wherein the end of operation comprises the shutdown of a MoGen charging and discharging the battery.

6. A method of determining the state of charge of a nickel metal hydride battery comprising:
   determining whether the nickel metal hydride battery is in a charge increasing, charge sustaining, or charge decreasing mode;
   integrating coulombs charging and discharging the battery to determine a first state of charge measurement in a charge increasing or charge sustaining mode; and
   determining the open circuit voltage to determine a second state of charge measurement in a charge decreasing mode.

7. The method of claim 6 wherein the step of determining whether the nickel metal hydride battery is in a charge increasing, charge sustaining, or charge decreasing mode comprises calculating average current over a time period.

8. The method of claim 7 wherein the time period is a minute.

9. The method of claim 6 further comprising the step of determining a third state of charge measurement of the nickel metal hydride battery based on the measured open circuit voltage during a period of substantial inactivity for the battery.

10. The method of claim 9 wherein the period of substantial inactivity for the battery is determined by the shutdown of a MoGen charging and discharging the nickel metal hydride battery.

11. The method of claim 9 further comprising the step of comparing the first, second and third state of charge measurements and the vehicle operation to predict the actual state of charge of the nickel metal hydride battery.

12. A method of determining the state of charge of a battery operating in a charge increasing, charge sustaining, and charge decreasing mode, the method comprising:
   integrating current charging and discharging the battery to determine a first state of charge measurement;
   determining the open circuit voltage to determine a second state of charge measurement by using a set of data points mapping open circuit voltage to state of charge for the battery; and
   determining which of the first state of charge measurement or the second state of charge measurement more accurately represents the actual state of charge of the battery.

13. The method of claim 12 wherein the step of determining whether the first state of charge measurement or the second state of charge measurement more accurately represents the actual state of charge of the battery comprises using the first state of charge measurement as the state of charge measurement when the battery operates in a charge increasing or charge sustaining mode.

14. The method of claim 12 wherein the step of determining whether the first state of charge measurement or the second state of charge measurement more accurately represents the actual state of charge of the battery comprises using the second state of charge measurement as the state of charge measurement when the battery operates in a charge decreasing mode.

15. The method of claim 12 further comprising the step of determining whether the nickel metal hydride battery is in a charge increasing, charge sustaining, or charge decreasing mode by calculating average current over a time period.

16. A battery state of charge measurement apparatus comprising:
   a battery pack comprising at least one battery module;
   a current sensor coupled to said battery pack to sense current charging and discharging the battery;
   a voltage sensor coupled to said battery pack to sense voltage of the battery; and
   a controller coupled to said current and voltage sensors, said controller generating a current-based state of charge measurement and a voltage-based state of charge measurement.

17. The battery state of charge apparatus of claim 16 further comprising a motor-generator coupled to said battery pack to charge and discharge said battery pack.

* * * * *